(12) United States Patent
Hyon et al.

(10) Patent No.: US 10,337,103 B2
(45) Date of Patent: Jul. 2, 2019

(54) SUBSTRATE PROCESSING APPARATUS

(71) Applicant: EUGENE TECHNOLOGY CO., LTD., Yongin-Si, Gyeonggi-Do (KR)

(72) Inventors: Jun Jin Hyon, Gunpo-Si (KR); Sung Tae Je, Yongin-Si (KR); Byoung Gyu Song, Yongin-Si (KR); Yong Ki Kim, Osan-Si (KR); Kyoung Hun Kim, Yongin-Si (KR); Chang Dol Kim, Yongin-Si (KR); Yang Sik Shin, Yongin Si (KR); Jae Woo Kim, Bucheon-Si (KR)

(73) Assignee: EUGENE TECHNOLOGY CO., LTD. (KR)

( * ) Notice: Subject to any disclaimer, the term of this patent is extended or adjusted under 35 U.S.C. 154(b) by 255 days.

(21) Appl. No.: 15/220,385

(22) Filed: Jul. 26, 2016

(65) Prior Publication Data

US 2017/0073813 A1 Mar. 16, 2017

(30) Foreign Application Priority Data

Sep. 11, 2015 (KR) .......................... 10-2015-0128971

(51) Int. Cl.
*C23C 16/455* (2006.01)
*C30B 25/14* (2006.01)
*C23C 16/458* (2006.01)

(52) U.S. Cl.
CPC .... *C23C 16/45578* (2013.01); *C23C 16/4583* (2013.01); *C23C 16/45504* (2013.01)

(58) Field of Classification Search
CPC .......... C23C 16/45578; C23C 16/4583; C23C 16/45504; C30B 25/14

USPC ......................... 118/715; 156/345.33, 345.34
See application file for complete search history.

(56) References Cited

U.S. PATENT DOCUMENTS

| | | | | |
|---|---|---|---|---|
| 4,264,393 | A * | 4/1981 | Gorin | C23C 16/509 118/620 |
| 5,061,359 | A * | 10/1991 | Babu | C23C 14/56 156/345.44 |
| 5,711,811 | A * | 1/1998 | Suntola | C23C 8/06 118/715 |
| 5,968,593 | A * | 10/1999 | Sakamoto | H01L 21/67109 118/715 |

(Continued)

FOREIGN PATENT DOCUMENTS

| | | |
|---|---|---|
| CN | 101288157 A | 10/2008 |
| CN | 103946956 A | 7/2014 |

(Continued)

*Primary Examiner* — Rudy Zervigon
(74) *Attorney, Agent, or Firm* — Renaissance IP Law Group LLP (57) ABSTRACT

Provided is a substrate processing apparatus including a tube having an inner space therein, a substrate supporting unit including a plurality of isolation plates configured to vertically stack a plurality of substrates thereon and divide a processing space, in which the plurality of substrates are processed, into a plurality of processing spaces in the tube, a gas supply unit configured to supply a processing gas to the plurality of substrates, and an exhaust unit disposed to face the gas supply unit to exhaust a gas inside the tube. A plurality of through-holes are defined in each of the isolation plates.

5 Claims, 6 Drawing Sheets

(56) References Cited

U.S. PATENT DOCUMENTS

| | | | | | |
|---|---|---|---|---|---|
| 6,042,652 | A * | 3/2000 | Hyun | ..................... | C23C 16/44 118/715 |
| 6,204,194 | B1 * | 3/2001 | Takagi | ................ | C23C 16/4412 257/E21.279 |
| 6,572,705 | B1 * | 6/2003 | Suntola | ................ | C23C 16/455 118/696 |
| 7,032,536 | B2 * | 4/2006 | Fukuoka | ............ | C23C 16/5096 118/723 E |
| 7,727,296 | B2 * | 6/2010 | Tojo | ....................... | B01D 45/06 118/715 |
| 7,927,455 | B2 * | 4/2011 | Kishimoto | .............. | C23C 16/24 118/723 E |
| 7,974,524 | B2 * | 7/2011 | Yamazaki | ......... | H01L 21/67109 392/407 |
| 8,092,640 | B2 * | 1/2012 | Kishimoto | .......... | H01J 37/3244 118/723 E |
| 8,293,014 | B2 * | 10/2012 | Kurokawa | ......... | C23C 16/4404 118/663 |
| 8,394,201 | B2 * | 3/2013 | Kim | .................. | C23C 16/45546 118/715 |
| 9,255,329 | B2 * | 2/2016 | Chiang | ............. | C23C 16/45534 |
| 9,410,247 | B2 * | 8/2016 | Lee | .................... | C23C 16/45578 |
| 9,453,683 | B2 * | 9/2016 | Takenaga | ................ | F27D 19/00 |
| 9,593,415 | B2 * | 3/2017 | Yan | .................... | C23C 16/4412 |
| 9,620,395 | B2 * | 4/2017 | Yang | .................... | C23C 16/4412 |
| 9,869,019 | B2 * | 1/2018 | Yang | .................... | H01L 21/67126 |
| 9,875,895 | B2 * | 1/2018 | Yang | .................... | C23C 16/4412 |
| 9,953,850 | B2 * | 4/2018 | Yang | .................... | H01L 21/6719 |
| 2005/0251990 | A1 * | 11/2005 | Choi | ..................... | C23C 16/345 29/558 |
| 2009/0255630 | A1 * | 10/2009 | Toyoda | ............. | H01J 37/32009 156/345.43 |
| 2009/0311807 | A1 * | 12/2009 | Yamaga | ............ | H01L 21/67109 438/5 |
| 2010/0006031 | A1 * | 1/2010 | Choi | ................. | C23C 16/45565 118/723 R |
| 2010/0083898 | A1 * | 4/2010 | Kogura | ................. | C23C 16/405 118/692 |
| 2010/0162958 | A1 * | 7/2010 | Kurokawa | .............. | C23C 16/24 118/725 |
| 2012/0000425 | A1 * | 1/2012 | Park | .................. | C23C 16/45565 118/724 |
| 2012/0171815 | A1 * | 7/2012 | Maeng | ................... | C23C 16/303 438/107 |
| 2013/0098293 | A1 * | 4/2013 | Lee | .................... | C23C 16/45578 118/728 |
| 2013/0333616 | A1 * | 12/2013 | Klindworth | ............. | C23C 16/50 118/719 |
| 2014/0134332 | A1 * | 5/2014 | Sugino | ............. | C23C 16/45578 427/255.5 |
| 2014/0209024 | A1 * | 7/2014 | Kim | .................. | H01L 21/67051 118/719 |
| 2014/0315375 | A1 * | 10/2014 | Yang | .................... | C23C 16/4412 438/488 |
| 2014/0345528 | A1 * | 11/2014 | Yang | ................. | H01L 21/67126 118/723 I |
| 2014/0345801 | A1 * | 11/2014 | Yang | .................... | C23C 16/4412 156/345.27 |
| 2015/0013909 | A1 * | 1/2015 | Yang | ................... | C23C 16/4412 156/345.29 |
| 2017/0073810 | A1 * | 3/2017 | Hyon | .................. | C23C 16/4412 |
| 2017/0073813 | A1 * | 3/2017 | Hyon | ................ | C23C 16/45578 |

FOREIGN PATENT DOCUMENTS

| | | |
|---|---|---|
| CN | 104025259 A | 9/2014 |
| JP | 2000182979 A | 6/2000 |
| JP | 2002222806 A | 8/2002 |
| JP | 2003100579 A | 4/2003 |
| JP | 2003297818 A | 10/2003 |
| JP | 2008258595 A | 10/2008 |
| JP | 4399452 B2 | 1/2010 |
| JP | 2015503247 A | 1/2015 |
| KR | 20080045739 A | 5/2008 |
| KR | 101390474 B1 | 5/2014 |
| KR | 20150045012 A | 4/2015 |
| TW | I260679 B | 8/2006 |
| TW | 200639908 A | 11/2006 |
| TW | 201443998 B | 11/2014 |
| WO | 2005069361 A1 | 7/2005 |
| WO | 2006035879 A1 | 4/2006 |

* cited by examiner

SUBSTRATE PROCESSING APPARATUS

CROSS-REFERENCE TO RELATED APPLICATION

This application claims priority to Korean Patent Application No. 10-2015-0128971 filed on Sep. 11, 2015 and all the benefits accruing therefrom under 35 U.S.C. § 119, the contents of which are incorporated by reference in their entirety.

BACKGROUND

The present disclosure relates to a substrate processing apparatus, and more particularly, to a substrate processing apparatus capable of controlling flow of a gas to enable a thin film on a substrate to be uniform.

In general, a substrate processing apparatus is classified into a single wafer type apparatus capable of performing a substrate processing process for one substrate and a batch type apparatus capable of simultaneously performing the substrate processing process for a plurality of substrates. Since the single wafer type apparatus has low productivity although it has a simple constitution, the batch type apparatus is commonly used for mass-production.

The batch type substrate processing apparatus includes a processing chamber in which substrates multi-stacked in a horizontal state are accommodated to be processed, a processing gas supply nozzle supplying a processing gas into the processing chamber, and an exhaust line for exhausting the inside of the processing chamber. The substrate processing process using the batch type substrate processing apparatus is performed as follows. First, a plurality of substrates are loaded into the processing chamber. Thereafter, while the inside of the processing chamber is exhausted through the exhaust line, the processing gas is supplied into the processing chamber through the processing gas supply nozzle. Thereafter, the processing gas injected from the processing gas supply nozzle passes between the substrates and introduced to the exhaust line through an exhaust port to form a thin film on the substrate.

However, since a conventional substrate processing apparatus may not control the flow of the processing gas, the thickness of the thin film at an outer portion and a central portion of the substrate may not be uniform. Thus, the think film may decrease in quality and defects may occur.

PRIOR ART DOCUMENTS

Patent Documents (Patent Document 1) KR2015-0045012 A

SUMMARY

The present disclosure provides a substrate processing apparatus capable of uniformly forming a thin film on a substrate The present disclosure also provides a substrate processing apparatus capable of enhancing efficiency of a substrate processing process.

In accordance with an exemplary embodiment, a substrate processing apparatus includes: a tube having an inner space therein; a substrate supporting unit including a plurality of isolation plates configured to vertically stack a plurality of substrates thereon and divide a processing space, in which the plurality of substrates are processed, into a plurality of processing spaces in the tube; a gas supply unit configured to supply a processing gas to the plurality of substrates; and an exhaust unit disposed to face the gas supply unit to exhaust a gas inside the tube, in which a plurality of through-holes are provided in each of the isolation plates.

The plurality of isolation plates may be vertically spaced apart from each other, and the plurality of substrates may be spaced apart from the plurality of isolation plates and stacked between the plurality of isolation plates, respectively The gas supply unit may include a plurality of injection nozzles installed at heights different from each other to respectively correspond to the processing spaces at one side of the tube, and the exhaust unit may include a plurality of exhaust ports vertically installed to correspond to the injection nozzle on the other side of the tube.

At least a portion of the injection nozzle may pass through the tube.

The plurality of through-holes may be defined radially toward a substrate disposed therebelow.

The sum of effective areas of the through-holes defined in a central portion of the isolation plate may be different from that of effective areas of the through-holes defined in an outer portion thereof.

The total sum of the areas of the plurality of through-holes may be 5% to 50% with respect to an entire area of the isolation plates.

The through-hole may extend in a direction crossing a flow direction of a gas flowing from the gas supply unit to the exhaust unit, and the plurality of through-holes may be defined in a line along the flow direction of the gas.

The sum of effective areas of the through-holes disposed adjacent to the gas supply unit may be different from that of effective areas of the through-holes disposed far from the gas supply unit with respect to a central portion of the isolation plate.

The total sum of the areas of the plurality of through-holes may be 5% to 50% with respect to an entire area of the isolation plate.

DETAILED DESCRIPTION OF EMBODIMENTS

Hereinafter, specific embodiments will be described in detail with reference to the accompanying drawings. The present disclosure may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity and like reference numerals refer to like elements throughout.

Figure 1:
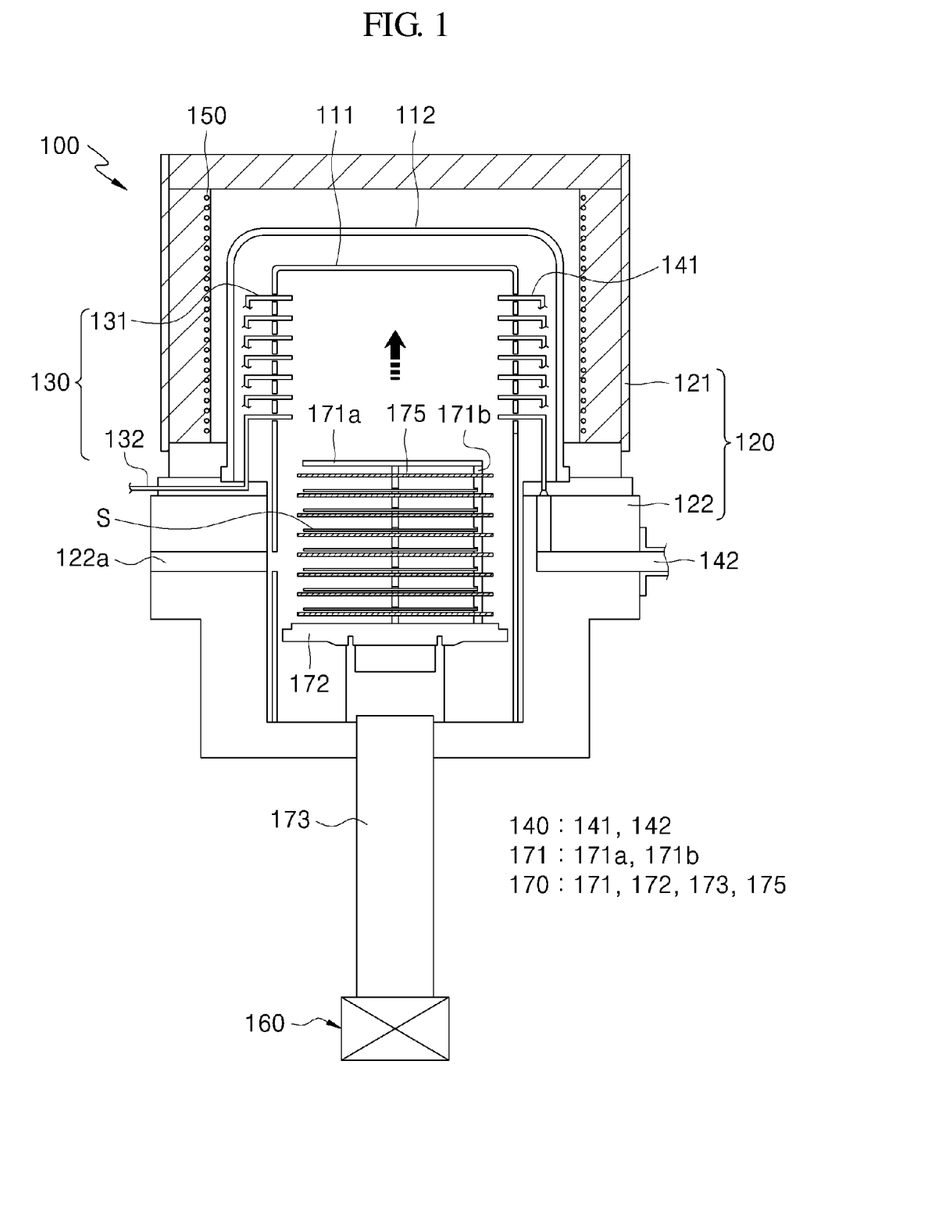
FIGS. 1 and 2 are views illustrating a structure of a substrate processing apparatus in accordance with an exemplary embodiment.
Figure 2:
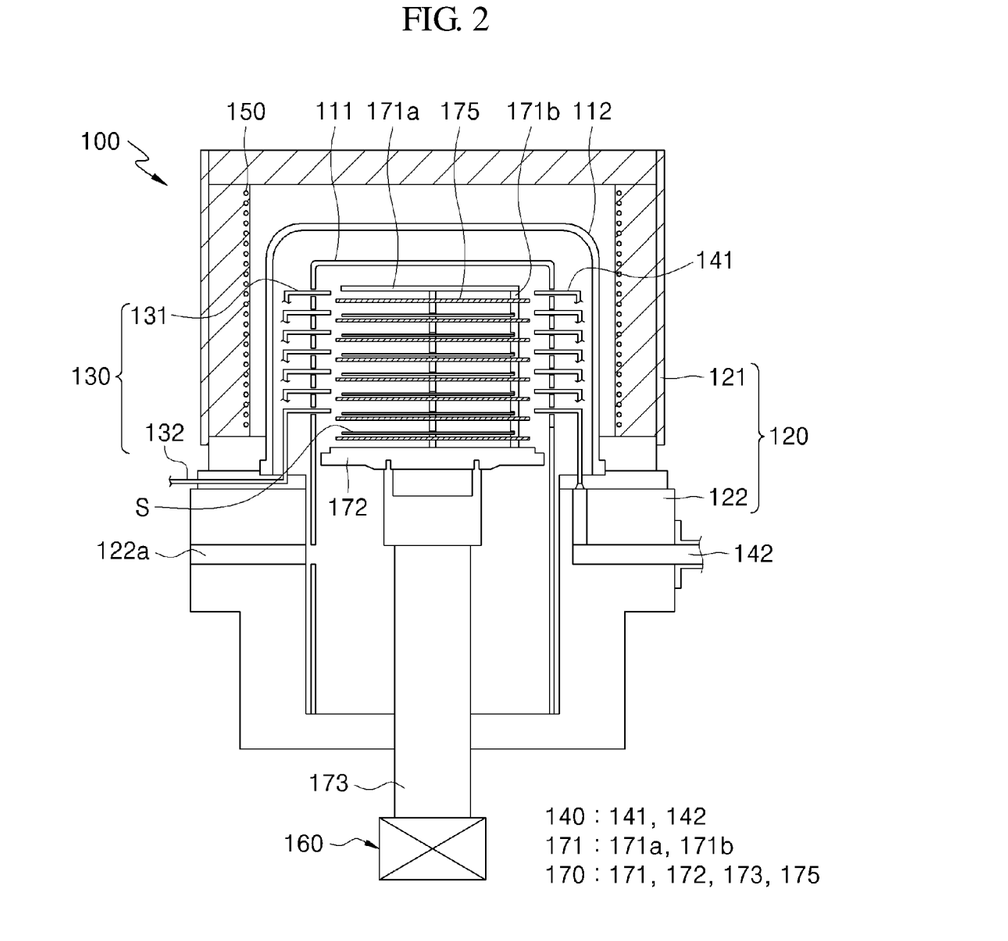
Figure 3:
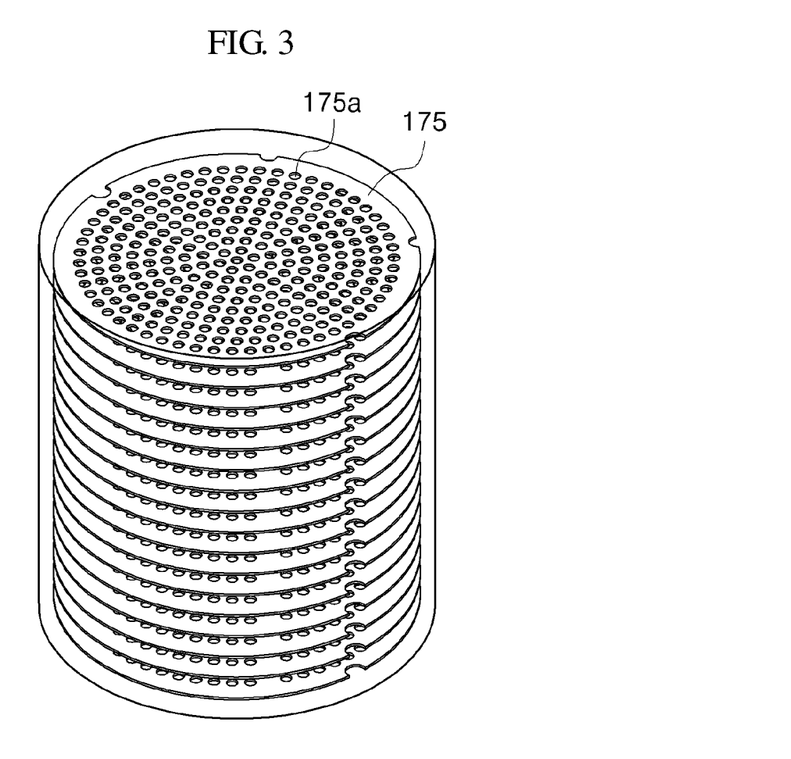
FIG. 3 is a view illustrating a structure of an isolation plate in accordance with an exemplary embodiment.
Figure 4:
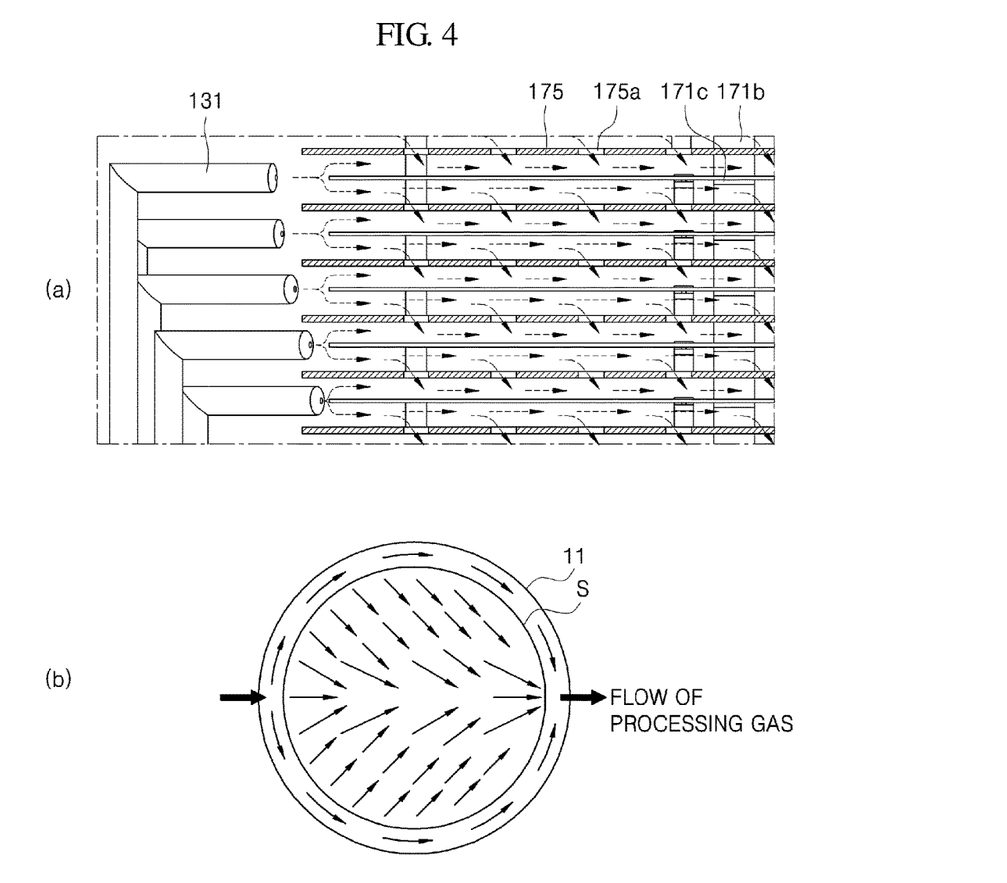
FIG. 4 is a view illustrating flow of a processing gas in a tube in accordance with an exemplary embodiment.
Figure 5:
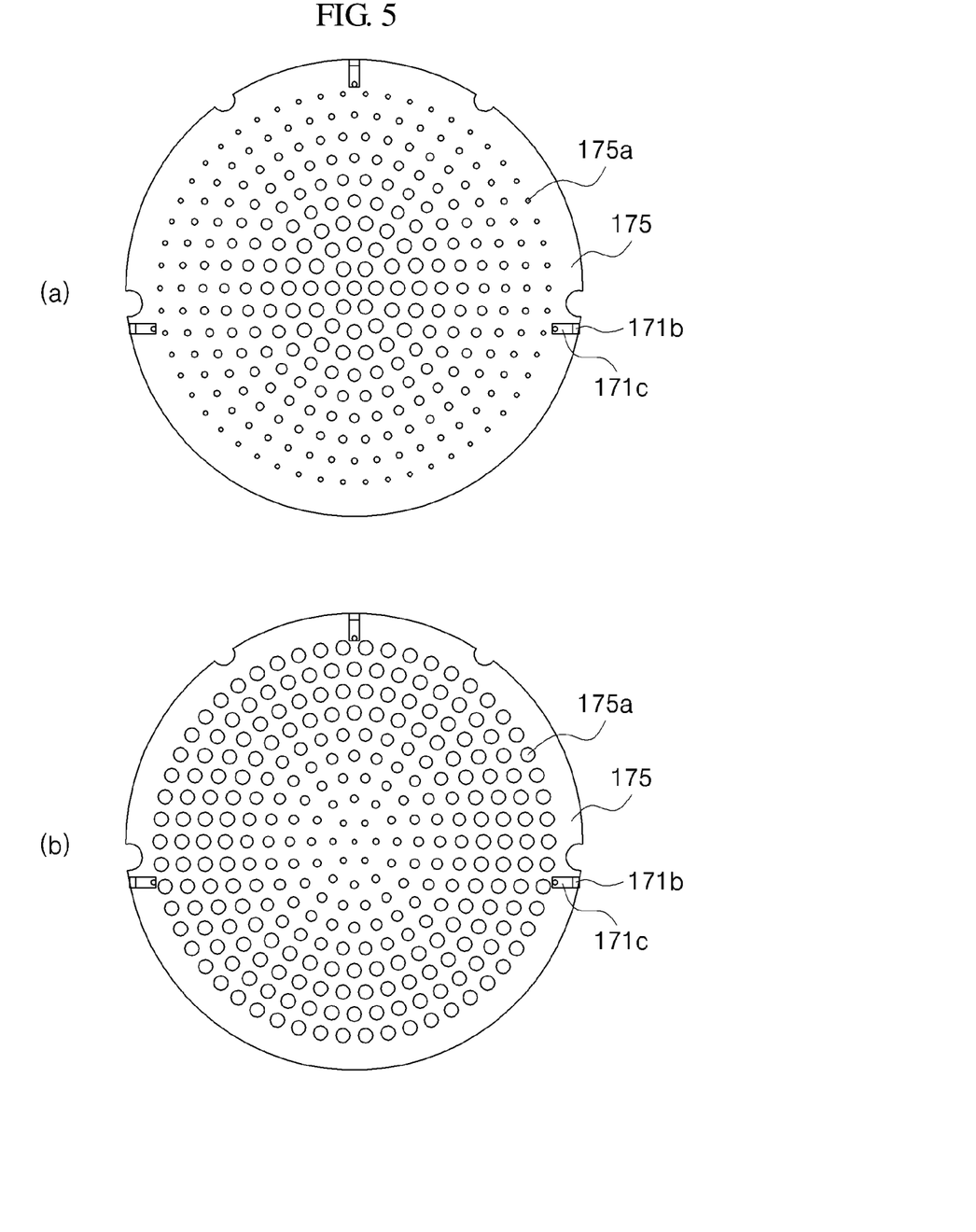
FIG. 5 is a view illustrating an isolation plate in accordance with another exemplary embodiment.
Figure 6:
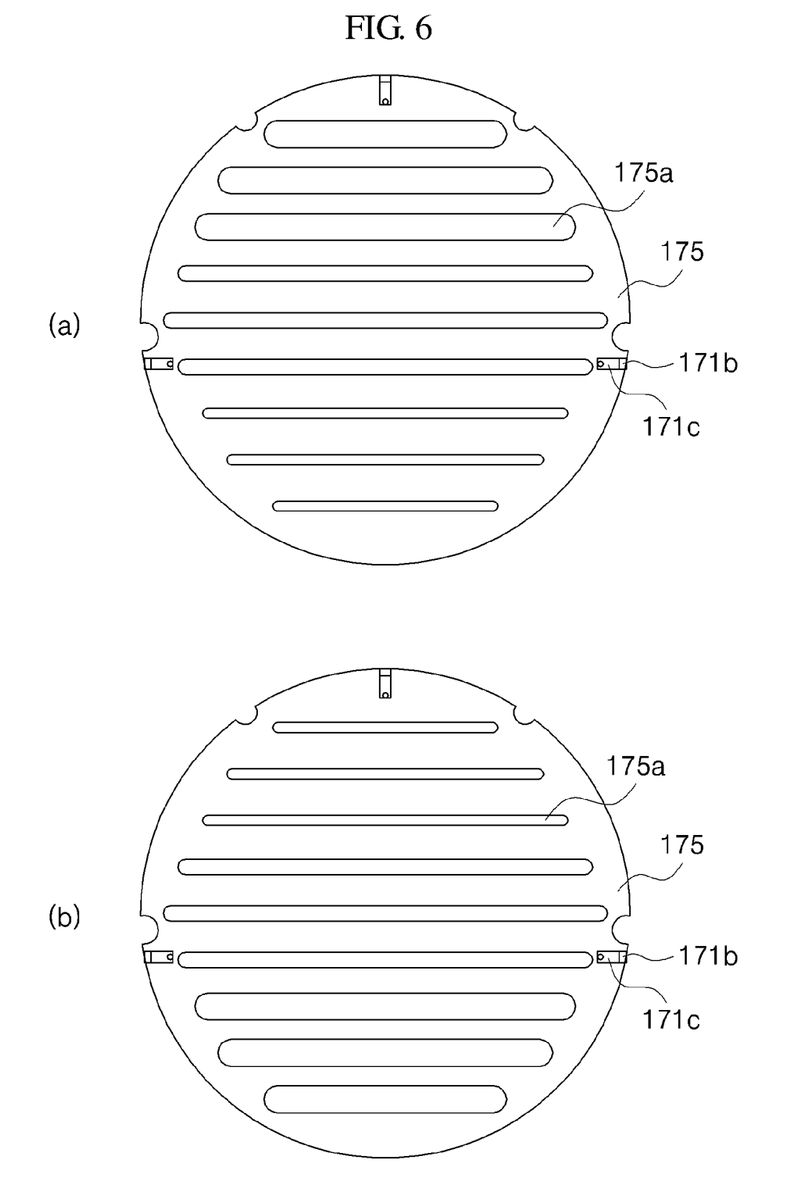
FIG. 6 is a view illustrating an isolation plate in accordance with still another exemplary embodiment.

FIGS. 1 and 2 are views illustrating a structure of a substrate processing apparatus in accordance with an exemplary embodiment, FIG. 3 is a view illustrating a structure of an isolation plate in accordance with an exemplary embodiment, FIG. 4 is a view illustrating flow of a processing gas in a tube in accordance with an exemplary embodiment, FIG. 5 is a view illustrating an isolation plate in accordance with another exemplary embodiment, and FIG. 6 is a view illustrating an isolation plate in accordance with still another exemplary embodiment.

Referring to FIGS. 1 and 2, a substrate processing apparatus 100 in accordance with an exemplary embodiment includes a tube 111 having an inner space defined therein, a substrate supporting unit 170 vertically stacking a plurality of substrates S in the tube 111, a gas supply unit 130 supplying a processing gas to the plurality of substrates S, and an exhaust unit 140 exhausting a gas in the tube 111. Also, the substrate processing apparatus 100 may include a chamber 120 having an inner space therein, an outer tube 112 disposed in the inner space of the chamber 120 and disposed outside the tube 111 to surround the tube 111, a heating unit 150 heating an inside of the tube 111, and a driving unit vertically moving or rotating the substrate supporting unit 170.

Here, the substrate processing apparatus 100 in accordance with an exemplary embodiment may be an epitaxial apparatus forming an epitaxial layer on the substrate S. When a selective epitaxial growth (SEG) process is performed on the substrate S, the processing gas is supplied to whole processing spaces. The processing gas may include at least one of a fuel gas, an etching gas, a dopant gas, and a carrier gas, and the gases may be mixed at various ratios and supplied to control the thickness of the thin film on the substrate S. Since each of these gases has a different molecular weight, the flow of the processing gas may be varied according to the ratio. Accordingly, in the SEG, the stream or flow of the processing gas may be a major factor for determining the thickness and composition of the thin film on the substrate S. Thus, the isolation plate 170 in accordance with an exemplary embodiment is provided to adjust the flow of the processing gas.

The chamber 120 may have the shape of a rectangular container or a cylinder. The chamber 120 may include an upper body 121 and a lower body 122, and a lower portion of the upper body 121 and an upper portion of the lower body 122 are connected to each other. An entrance hole 122a through which the substrate S is loadable/unloadable may be provided to a side surface of the lower body 122. Thus, the substrate S may be loaded into the chamber 120 through the entrance hole 122a. Here, the substrates S loaded into the lower body 122 may move upward and be processed in the upper chamber 120. Thus, a stacking space in which the substrates S are stacked may be provided in the lower body 122, and a process space for the substrate S may be provided in the upper body 121. However, the structure and shape of the chamber 120 are not limited thereto. For example, the chamber 120 may have various shapes and structures.

The outer tube 112 may have a cylindrical shape and be disposed above the lower body 122 having an opened upper portion or disposed inside the upper body 121. The outer tube 112 has an inner space, in which the tube 111 is accommodated, therein and an opened lower portion. Here, an inner wall of the outer tube 112 and an outer wall of the tube 111 are spaced apart from each other to define a space therebetween. However, the structure and shape of the outer tube 112 are not limited thereto. For example, the outer tube may have various shapes and structures.

The tube 111 may have a cylindrical shape and be disposed inside the outer tube 112. The tube 111 has a space, into which the substrate S is accommodated, therein and an opened lower portion. Thus, the inside of the tube 111 may communicate with the inside of the lower body 122, and the substrate S may move between the tube 111 and the lower body 122. However, the structure and shape of the tube 111 are not limited thereto. For example, the tube 111 may have various shapes and structures.

The heating unit 150 may be a heater disposed outside the outer tube 112.

For example, the heating unit 150 may be inserted into the inner wall of the upper body 121 and disposed to surround the side surface and upper portion of the outer tube 112. Thus, when the heating unit 150 generates thermal energy, the thermal energy may pass through the outer tube 112 to raise an inner temperature of the tube 111. Accordingly, the heating unit 150 may be controlled to adjust the inner temperature of the tube 111 such that the inner temperature is appropriate to process the substrate S. However, the installation position of the heating unit 150 is not limited thereto. For example, the heating unit 150 may be installed at various positions.

The gas supply unit 130 may include a plurality of injection nozzles 131 injecting the processing gas to the substrate S disposed inside the tube 111 and a supply line 132 connected to the injection nozzles 131 to supply the processing gas.

At least a portion of the injection nozzles 131 passes through one side of the tube 111, e.g., the inner wall of the tube 111 and insertedly installed. The injection nozzles 131 are disposed at heights different from each other. That is, the injection nozzles 131 may be disposed to correspond to the processing spaces in which the substrates separated by the isolation plate 175 are processed, respectively. Thus, an amount of the processing gas supplied to each of the processing spaces may be individually controlled.

The supply line 132 may be provided in the form of a pipe and have one end connected to the injection nozzle 131 and the other end connected to a processing gas supply source (not shown). Thus, the processing gas supplied from the processing gas supply source may be supplied to the injection nozzle 131 through the supply line 132. For example, a plurality of supply lines 132 may be provided to be respectively connected to the injection nozzles 131. Alternatively, one supply line 132 may be divided in plurality to be respectively connected to the injection nozzles 131. Also, one or a plurality of control valves may be provided to the supply line 132 to control the amount of the processing gas supplied to the injection nozzle 131.

Also, the processing gas supply source may include a plurality of gas tanks (not shown). That is, since the processing gas may include at least one of a fuel gas, an etching gas, a dopant gas, and a carrier gas, tanks for respectively store the gases may be provided. However, the structure and shape of each of the processing gas supply source and the supply line 132 are not limited thereto. For example, each of the supply line 132 and the processing gas supply source may have various shapes and structures.

The exhaust unit 140 may include a plurality of exhaust ports 141 suctioning the gas in the tube 111 and an exhaust line 142 connected to the exhaust port 141 to exhaust the suctioned gas to the outside of the tube 111.

The exhaust ports 141 are installed to pass through the other side of the tube 111, which faces the injection nozzles 131, e.g., the inner wall of the tube 111 and disposed at heights different from each other. That is, the plurality of exhaust ports 141 may be vertically disposed to correspond to the injection holes 131, respectively.

Accordingly, the processing gas supplied from the injection nozzle 131 may pass through the processing space to flow toward the exhaust port 141 that is opposite to the injection nozzle 131. Thus, enough time for reaction between the processing gas and a surface of the substrate S may be secured. Here, a non-reacting gas and reaction by-products that are generated during the substrate processing process may be suctioned and exhausted through the exhaust port 141.

The exhaust line 142 may be provided in the form of a pipe and have one end connected to the exhaust port 141 and the other end connected to a suction part (not shown). Here, the gas in the tube 111 may be suctioned to the exhaust port 141 by suction force provided from the suction part and exhausted to the outside along the exhaust line 142. For example, a plurality of exhaust lines 142 may be provided to be connected to the exhaust ports 141, respectively. Alternatively, one exhaust line 142 may be divided in plurality to be respectively connected to the exhaust ports 141. Alternatively, the exhaust line 142 may be provided in the form of a duct and connected to the plurality of exhaust ports 141. However, the structure and shape of the exhaust line 142 are not limited thereto. For example, the exhaust line 142 may have various shapes and structures.

Meanwhile, the injection nozzle 131 may be disposed inside the outer tube 112.

Accordingly, the inner space of the tube 111 may be double-sealed by the inner wall of the tube 111 and the inner wall of the outer tube 112 to efficiently block the gas in the tube 111 from being leaked to the outside or external foreign substances from being introduced into the tube 111. Also, since the supply line 132 or the exhaust line 142 are not provided to the tube 111, inner space efficiency of the tube 111 may increase.

The driving unit 160 may include a vertical driving part vertically moving the substrate supporting unit 170 and a rotation driving part rotating the substrate supporting unit 170.

The vertical driving part may be a cylinder and connected to a lower portion of the substrate supporting unit 170 to vertically move the substrate supporting unit 170. Accordingly, the substrate supporting unit 170 on which the substrates S are stacked may vertically move between the tube 111 and the lower chamber 120. That is, when the substrate supporting unit 170 moves downward by the vertical driving part, the substrate S is loaded into the substrate supporting unit 170 through the entrance hole 122a of the lower body 122, and when all of the substrates S are loaded in the substrate supporting unit 170, the vertical driving part move the substrate supporting unit 170 into the upper tube 111 to perform the processing process for the substrates S.

The rotation driving part may be a motor and connected to the lower portion of the substrate supporting unit 170 to rotate the substrate supporting unit 170. When the substrate supporting unit 170 rotates by using the rotation driving part, the processing gas flowing to pass through the substrates S stacked on the substrate supporting unit 170 is mixed to be uniformly distributed on the upper portion of the substrate S. Thus, a film deposited on the substrate S may increase in quality. However, the method in which the substrate supporting unit 170 vertically moves and rotates by the driving unit 160 is not limited thereto. For example, the substrate supporting unit 170 may move and rotate through various methods.

The substrate supporting unit 170 may include a substrate holder 171 supporting the substrate S, a blocking plate 172 capable of sealing the inside of the tube 111, a shaft 173 supporting the substrate holder 171, a plurality of isolation plates 175 dividing the processing space in which the plurality of substrates are processed and spaced apart from the substrate S to be disposed between the plurality of substrates.

The substrate holder 171 is provided so that the plurality of substrates S are vertically stacked thereon. The substrate holder 171 may include a plurality of support bars 171b vertically extending and an upper plate 171a connected to the support bars 171b to support the support bars 171b. A support tip 171c for easily supporting the substrate S may protrude from the support bar 171b toward a center of the substrate S.

The upper plate 171a may be provided in the form of a circular plate and have a diameter greater than that of the substrate S. Three support bars 171b may be provided to be spaced apart from each other along a circumference of the upper plate 171a and connected to an outer lower portion of the upper plate. A plurality of support tips 171c may be provided and spaced in a line along an extension direction of the support bar 171b. Thus, the substrate holder 171 may form a plurality of floors on which the substrates S are vertically stacked, and one substrate S may be stacked on one floor (or one processing space). However, the structure and shape of the substrate holder 171 are not limited thereto. For example, the substrate holder 171 may have various shapes and structures.

Also, the injection nozzle 131, the substrate S, and the exhaust port 141 may be disposed in the same line. Accordingly, since the substrate S is lifted such that the lower surface of the substrate S is supported by the support tip 171c, the processing gas injected from the injection nozzle 131 may pass through the substrate S and be suctioned into the exhaust port 141 to form laminar flow. That is, the processing gas may contact a side surface of the substrate S, move along upper and lower surfaces of the substrate S, and then be introduced into the exhaust port 141. Thus, since the processing gas flows parallel to the substrate S, the processing gas may be uniformly supplied to the upper surface of the substrate S.

The blocking plate 172 may be provided in the form of a circular plate and have a diameter greater than that of the substrate holder 171. The blocking plate 172 is connected to the lower portion of the substrate holder 171. Accordingly, when the substrate holder 171 moves from the lower body 122 into the tube 111, the blocking plate 172 also moves upward together with the substrate holder 171 to close the opened lower portion of the tube 111. Thus, when the processing process for the substrate S is performed, the inside of the tube 111 may be sealed from the lower body 122, and the processing gas in the tube 111 may be prevented from being introduced to the lower body 122 or foreign substances in the lower body 122 may be prevented from being introduced into the tube 111. However, the structure and shape of the blocking plate 172 are not limited thereto. For example, the blocking plate 172 may have various shapes and structures.

The shaft 173 may be provided in the form of a vertically extending bar shape. The shaft 173 may have an upper end connected to the blocking plate 172 and a lower end connected to the vertical driving part and the rotation driving part of the driving unit 160. Thus, the substrate holder 171 may rotate by the rotation driving part with respect to a vertical central shaft of the shaft 173 and vertically move along the shaft 173 by the vertical driving part.

The isolation plate 175 may be provided in the form of a circular plate and provided in plurality to be vertically spaced apart from each other. Also, the plurality of isolation plates 175 may be spaced apart from the substrates S or the support tips 171c, respectively. That is, circumferences of the isolation plates 175 may be inserted into the support bars 171b and disposed between the support tips 171c, respectively. Accordingly, the isolation plates 175 may divide the processing space, in which the substrates S are processed, into a plurality of processing spaces, and the plurality of substrates may be respectively spaced apart from and disposed between the isolation plates 175. Thus, when the processing gas is injected from the injection nozzle 131, the processing gas may pass through upper and lower sides of the substrate S and suctioned to the exhaust port 141.

Referring to FIGS. 3 and 4, a plurality of through holes 175a may be defined in each of the isolation plate 175. For example, each of the through holes 175a may be provided with a circular shaped hole, and the plurality of through holes 175a may be radially defined in the isolation plate 175 toward the substrate S disposed at lower side thereof. Thus, a portion of the processing gas supplied from the injection nozzle 131 may pass through the processing space and suctioned to the exhaust port 141, and a portion of the processing gas passing through the lower side of the substrate S may be supplied to the lower processing space through the through hole 175a.

That is, the processing gas supplied to the lower side of the through hole 175a, i.e., a portion facing the through hole 175a may increase in amount. Accordingly, as the amount of the processing gas supplied to the upper surface of the substrate S through the through hole 175a may increase, the amount of the processing gas flowing along the circumference of the substrate S may relatively decrease. Thus, as the processing gas is concentrated on the upper surface of the substrate S, the amount of the processing gas involved in the substrate S processing process may increase and thus efficiency of the substrate processing process may increase.

For example, in the processing gas injected from the injection nozzle 131, the amount of the processing gas passing through the central portion of the substrate S and introduced to the exhaust port 141 by injection pressure may be greater than that of the processing gas flowing along the circumference or lower portion of the substrate S and introduced to the exhaust port 141. Accordingly, the amount of the processing gas excluded from the substrate S processing process may be greater than that of the processing gas substantially involved in the substrate S processing process in the upper surface of the substrate S Thus, the isolation plate 175 having the through-hole 175a defined therein may be disposed above the substrate S to increase the amount of the processing gas supplied to the upper surface of the substrate S, especially the upper surface of the central portion of the substrate S. Thus, the processing gas excluding from the substrate S processing process, i.e., the processing gas flowing along the circumference and lower side of the substrate S may be supplied to the upper surface of the substrate S in the lower processing space through the through-hole 175a to involve in the substrate S processing process in the lower processing space. Thus, a portion of the processing gas flowing along the circumference and lower side of the substrate S may be introduced to the through-hole 175a to decrease the amount of gas flowing along the circumference and lower side of the substrate S and increase the amount of the processing gas supplied to the upper surface of the substrate S and substantially involved in the substrate S processing process.

Also, when the shape or structure of the through-hole 175a is adjusted, the processing gas may be concentrated on a desired position. That is, the shape or structure of the through-hole 175a may be adjusted so that the sum of effective areas (actual area of the through-holes 175a per unit area of the substrate S) of the through-holes 175a defined in a central portion of the isolation plate 175 and the sum of effective areas of the through-holes 175a defined in an outer portion thereof are different from each other. The size of the through-hole 175a or the density of the through-holes 175a may be adjusted to adjust the effective area of the through-holes 175a defined in the central portion and the outer portion.

For example, in the processing gas injected from the injection nozzle 131, the amount of the processing gas passing through the central portion of the substrate S and introduced to the exhaust port 141 by the injection pressure may be greater than that of the processing gas flowing along the circumference or lower portion of the substrate S and introduced to the exhaust port 141. Thus, the amount of the processing gas supplied to the central portion of the substrate S may be less than that of the processing gas supplied to the circumference or lower portion of the substrate S, and the thin film formed on the outer portion of the substrate S may be greater in thickness than that formed on the central portion thereof.

Accordingly, to increase the amount of the processing gas supplied to the upper surface of the substrate S, especially the upper surface of the central portion of the substrate S, the isolation plate 175 in which the through-holes 175a gradually increase in diameter from the outer portion to the central portion may be disposed above the substrate S. As in (a) of FIG. 5, the through-hole 175a may be manufactured such that the through-holes 175a gradually increase in diameter from the outer portion to the central portion of the isolation plate 175.

That is, the diameter of the through-hole 175a defined in the central portion of the isolation plate 175 may be greater than that of the through-hole 175a defined in the outer portion of the isolation plate 175. Accordingly, since the through-hole 175 of the central portion is greater in size than that of the outer portion, the amount of the processing gas supplied to the lower processing space through the through-hole 175a of the central portion may be greater than that of the processing gas supplied to the lower processing space through the through-hole 175a of the outer portion. Thus, as the processing gas is concentrated on the central portion of the substrate S through the through-hole 175a, which has the great diameter, of the central portion, the thin film may be formed to have a uniform thickness over the entire upper surface of the substrate S.

On the contrary, when the thin film of the central portion of the substrate S is greater in thickness than that of the outer portion thereof, the amount of the processing gas supplied to the central portion of the substrate S is greater than that of the processing gas supplied to the outer portion thereof. Thus, to increase the amount of the processing gas supplied to the outer portion of the substrate S, the isolation plate 175 in which the diameters of the through-holes 175a that gradually decrease from the outer portion to the central portion thereof may be disposed above the substrate S. Alternatively, as in (b) of FIG. 5, the through-hole 175a may be manufactured such that the diameters of the through-holes 175a gradually decrease from the outer portion to the central portion of the isolation plate 175.

That is, the diameter of the through-hole 175a defined in the central portion of the isolation plate 175 may be less than that of the through-hole 175a defined in the outer portion thereof. Accordingly, the amount of the processing gas supplied to the lower processing space through the through-hole 175a of the central portion may be less than that of the processing gas supplied to the lower processing space through the through-hole 175a of the outer portion. Thus, as the processing gas is concentrated on the outer portion of the substrate S through the through-hole 175a, which has the great diameter, of the outer portion, the thin film may be formed to have the uniform thickness over the entire upper surface of the substrate S.

Also, while the through-holes 175a may have the same diameters as each other, the density of the through-holes 175a may be adjusted to adjust the amount of the processing gas supplied onto the substrate S. That is, when the amount of the processing gas supplied to the central portion of the substrate S increases, the number of the through-holes 175a of the central portion of the isolation plate 175 may increase, and the number of the through-holes 175a of the outer portion may decrease. Thus, the greater amount of the processing gas may pass through the central portion in which more through-holes 175a are provided than the outer portion and supplied to the central portion of the substrate S.

On the contrary, when the amount of the processing gas supplied to the outer portion of the substrate S increases, the number of the through-holes 175a of the central portion of the isolation plate 175 may decrease, and the number of the through-holes 175a of the outer portion may increase Thus, the greater amount of the processing gas may pass through the outer portion in which more through-holes 175a are provided than the central portion and supplied to the outer portion of the substrate S. Also, the diameter and density of the through-holes 175a may be adjusted together to adjust the amount of the supplied processing gas.

Here, the total sum of areas of the plurality of through-holes 175a may be 5% to 50% with respect to an entire area of the isolation plate 175. That is, when the total area of the through-holes 175a is less than 5% with respect to the area of the isolation plate 175, the amount of the processing gas supplied to the lower processing space through the through-hole 175a may be too small and thus effect of providing the through-hole 175a is insignificant. Accordingly, the amount of the processing gas supplied to the upper surface of the substrate S and involved in the substrate S processing process may be small, and the amount of the processing gas flowing along the circumference and lower side of the substrate S and suctioned to the exhaust port 141 may be great to waste the processing gas. Thus, to supply enough amount of the processing gas to the upper surface of the substrate S and involve in the substrate S processing process, the total sum of the areas of the through-holes 175a may be equal to or greater than 5% with respect to the total area of the isolation plate 175.

On the contrary, when the total area of the through-holes 175a exceeds 50% with respect to the area of the isolation plate 175, the amount of the processing gas supplied to the lower processing space through the through-hole 175a may greatly increase to decrease the amount of the processing gas passing through the processing space to which the processing gas is substantially injected.

That is, since the process gas needs to be uniformly supplied to the upper and lower sides of the substrate S to form the laminar flow, the amount of the processing gas flowing to the lower side of the substrate S through the through-hole 175a may increase. Thus, the balance of the processing gas supplied to the upper and lower sides of the substrate S may be broken not to form the laminar flow. Accordingly, the substrate S processing process using the processing gas may not be performed correctly not to properly form the thin film. Thus, to enable enough amount of the processing gas to flow into the processing space to which the processing gas is substantially injected or enable the processing gas to form the laminar flow, the total area of the through-holes 175a may be equal to or less than 50% with respect to the area of the isolation plate 175.

Meanwhile, the through hole 175a may have a different shape. For example, the through-hole 175a may extend in a direction crossing the flow direction of the gas flowing from the gas supply unit 130 to the exhaust unit 140. That is, the through hole 175a may be provided in the form of a slit to have a long length. Also, the plurality of through holes 175a may be disposed in a line along the flow direction of the gas. Accordingly, a portion of the processing gas supplied from the injection nozzle 131 may pass through the processing space and then be suctioned to the exhaust port 141, and a portion thereof may be supplied to the lower processing space through the through-hole 175a.

That is, the amount of the processing gas supplied to the portion facing the through-hole 175a of the substrate S may increase. Accordingly, the amount of the processing gas flowing along the circumference of the substrate S may relatively decrease, and the amount of the processing gas supplied to the upper surface of the substrate S may relatively increase. Thus, the processing gas may be concentrated on the upper surface of the substrate S and the amount of the processing gas involved in the substrate S processing process may increase to thereby increase the efficiency of the substrate S processing process.

Also, the processing gas supplied onto the substrate S through the through-holes 175a may change the flow direction of the processing gas supplied through the injection nozzle 131 toward the upper surface of the substrate S. That is, as the processing gas supplied from the through-holes 175a enables the processing gas flowing from one side to the other side to flow from the upper side to the lower side, more amount of the processing gas may contact the upper surface of the substrate S. Thus, the efficiency of the substrate processing process may increase.

Also, the processing gas may be concentrated on the upper portion of the substrate S, especially the portion facing the through-hole 175a. Accordingly, the shape or structure of the through-hole 175a may be adjusted to concentrate the processing gas on a desired position. That is, with respect to the central portion of the isolation plate 175, the sum of effective areas of the through-holes 175a defined adjacent to the gas supply unit 130 and the sum of effective areas of the through-hole 175a defined far from the gas supply unit 130 may be different from each other.

For example, since the processing gas flows from the injection nozzle 131 to the exhaust port 141 to react at a position adjacent to the injection nozzle 131 of the substrate S, the thin film disposed adjacent to the injection nozzle 131 may be greater in thickness than that disposed far from the injection nozzle 131. Thus, to increase the amount of the processing gas supplied to a portion disposed far from the injection nozzle 131 of the substrate S, the isolation plate 175 in which the width of the through-hole 175a gradually increases from the gas supply unit 130 to the exhaust unit 140 may be disposed above the substrate S.

As in (a) of FIG. 6, the through-hole 175a may be manufactured such that the width of the through-hole 175a gradually increases from the gas supply unit 130 to the exhaust unit 140. That is, the width of the through-hole 175a defined adjacent to the gas supply unit 130 may be less than that of the through-hole 175a defined far from the gas supply unit 140. Accordingly, the amount of the processing gas supplied to the portion disposed adjacent to the gas supply unit 130 of the substrate S through the through-hole 175a may be less than that of the processing gas supplied to the portion disposed far from the gas supply unit 130. Thus, as the processing gas is concentrated on the portion disposed adjacent to the exhaust unit 140 of the substrate S through the through-hole 175a disposed adjacent to the exhaust unit 140, the thin film having a uniform thickness may be formed over the entire upper surface of the substrate S.

On the contrary, when the thickness of the thin film at the portion disposed adjacent to the gas supply unit 130 of the substrate S is less than that of the thin film at the portion disposed far therefrom. More processing gas may be supplied to the portion disposed far from the gas supply unit 130 than the portion disposed adjacent thereto. Thus, to increase the amount of the processing gas supplied to a portion, which is disposed adjacent to the gas supply unit 130, of the substrate S, the isolation plate 175 in which the width of the through-hole 175a gradually decreases from the gas supply unit 130 to the exhaust unit 140 may be disposed above the substrate S.

As in (b) of FIG. 6, the through-hole 175a may be manufactured such that the width of the through-hole 175a gradually decreases from the gas supply unit 130 to the exhaust unit 140. That is, the width of the through-hole 175a defined adjacent to the gas supply unit 130 may be greater than that of the through-hole 175a defined far therefrom. Accordingly, the amount of the processing gas supplied to the portion, which is disposed adjacent to the gas supply unit 130, of the substrate S may be greater than that of the processing gas supplied to the portion disposed far therefrom. Thus, as the processing gas is concentrated on the portion, which is disposed adjacent to the gas supply unit 130, of the substrate S through the through-hole 175a disposed adjacent to the exhaust unit 130, the thin film having the uniform thickness may be formed over the entire upper surface of the substrate S.

Here, the total sum of areas of the plurality of through-holes 175a may be 5% to 50% with respect to the entire area of the isolation plate 175. That is, when the total area of the through-holes 175a is less than 5% with respect to the area of the isolation plate 175, the amount of the processing gas supplied to the lower processing space through the through-hole 175a may be too small and thus the effect of providing the through-hole 175a is insignificant. Thus, to supply enough amount of the processing gas to the lower processing space, the total sum of the areas of the through-holes 175a may be equal to or greater than 5% with respect to the total area of the isolation plate 175.

On the contrary, when the total area of the through-holes 175a exceeds 50% with respect to the area of the isolation plate 175, the amount of the processing gas supplied to the lower processing space through the through-hole 175a may greatly increase to decrease the amount of the processing gas passing through the processing space to which the processing gas is substantially injected. Accordingly, the substrate S processing process using the processing gas may not be correctly performed not to properly form the thin film. Thus, to enable enough amount of the processing gas to flow into the processing space to which the processing gas is substantially injected, the total area of the through-holes 175a may be equal to or less than 50% with respect to the area of the isolation plate 175. However, the structure and shape of the through-holes 175a are not limited thereto. For example, each of the through-holes 175a may have various shapes and structures.

As described above, the plurality of through-holes 175a are provided to the isolation plate 175 so that a portion of the processing gas supplied to each of the processing spaces is supplied to the processing space of a different substrate S through the through-holes 175a of the isolation plate 175. That is, when the position of the through-hole 175a is adjusted, the processing gas may be concentrated on a desired position of the substrate S. Accordingly, when the through-holes 175a is defined in a portion corresponding to an area on which the thin film has small thickness, the processing gas is concentrated on the area on which the thin film has a small thickness so that the thickness of the thin film may be uniform over the entire substrate S. Thus, the think film may increase in quality and decrease in failure rate.

Also, the processing gas passing through the circumference and lower side of the substrate S and substantially excluding from the substrate S processing process is supplied to the upper surface of the substrate S through the through-hole 175a to induce the processing gas to be involved in the substrate S processing process. Thus, the amount of the wasted processing gas may decrease to enhance the efficiency of the substrate S processing process.

In accordance with the exemplary embodiments, the plurality of through-holes are provided to the isolation plate dividing the processing space into a plurality of processing spaces in which the substrates are respectively processed. Accordingly, a portion of the processing gas supplied to each of the processing spaces may be supplied to the processing space of different substrate through the through-holes of the isolation plate. That is, when the position of each of the through-holes is adjusted, the processing gas may be concentrated on a desired position on the substrate. Thus, when the through-hole is defined in a portion corresponding to an area on which the thin film has small thickness, the processing gas is concentrated on the area on which the thin film has a small thickness so that the thickness of the thin film may be uniform over the entire substrate. Thus, the thin film may increase in quality and decrease in failure rate.

Also, the processing gas passing through the circumference and lower side of the substrate and substantially excluding from the substrate processing process is supplied to the upper surface of the substrate through the through-hole to induce the processing gas to be involved in the substrate processing process. Thus, the amount of the wasted processing gas may decrease to enhance the efficiency of the substrate processing process.

Although a preferred embodiment of the present invention has been described in the detailed description of embodiments, various changes and modifications may be made thereto without departing from the scope and spirit of the present invention defined by the appended claims. Therefore, the scope of the invention is defined not by the detailed description of the invention but by the appended claims, and all differences within the scope will be construed as being included in the present invention.

What is claimed is:

1. A substrate processing apparatus comprising:
   a tube having an inner space therein;
   a substrate supporting unit comprising, in the tube, a substrate holder configured to stack a plurality of substrates, and a plurality of isolation plates configured to divide a processing space into a plurality of processing spaces, in which the plurality of substrates are processed, respectively, while being spaced apart from each other in a vertical direction;

a gas supply unit configured to supply a processing gas to the plurality of substrates; and an exhaust unit disposed to face the gas supply unit to exhaust a gas inside the tube, wherein the plurality of substrates are disposed in spaces between the isolation plates, respectively, while being spaced apart from the isolation plates, and a plurality of through-holes through which the processing gas passes are defined in the isolation plates so that a portion of the processing gas supplied to one processing space is supplied to another processing space, wherein the through-holes are formed in a slit shape extending in a direction crossing a flow direction of a gas flowing from the gas supply unit to the exhaust unit, and the plurality of through-holes are defined in a line along the flow direction of the gas.

2. The substrate processing apparatus of claim 1, wherein the gas supply unit comprises a plurality of injection nozzles installed at heights different from each other to respectively correspond to the processing spaces at one side of the tube, and the exhaust unit comprises a plurality of exhaust ports vertically installed to correspond to the injection nozzle on the other side of the tube.

3. The substrate processing apparatus of claim 2, wherein at least a portion of the injection nozzles passes through the tube.

4. The substrate processing apparatus of claim 1, wherein the sum of effective areas of the through-holes disposed adjacent to the gas supply unit is different from that of effective areas of the through-holes disposed far from the gas supply unit with respect to a central portion of the isolation plate.

5. The substrate processing apparatus of claim 4, wherein the total sum of the areas of the plurality of through-holes is 5% to 50% with respect to an entire area of the isolation plate.

* * * * *